(12) United States Patent  (10) Patent No.: US 7,598,098 B2
Lerner  (45) Date of Patent: Oct. 6, 2009

(54) MONITORING THE REDUCTION IN THICKNESS AS MATERIAL IS REMOVED FROM A WAFER COMPOSITE AND TEST STRUCTURE FOR MONITORING REMOVAL OF MATERIAL

(75) Inventor: Ralf Lerner, Erfurt (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 0 days.

(21) Appl. No.: 10/553,470

(22) PCT Filed: Apr. 16, 2004

(86) PCT No.: PCT/DE2004/000801

§ 371 (c)(1),
(2), (4) Date: May 19, 2006

(87) PCT Pub. No.: WO2004/095567

PCT Pub. Date: Nov. 4, 2004

(65) Prior Publication Data

US 2006/0292825 A1  Dec. 28, 2006

(30) Foreign Application Priority Data

Apr. 17, 2003  (DE) ............................... 103 17 747

(51) Int. Cl.
*H01L 21/66* (2006.01)
(52) U.S. Cl. .............................. 438/7; 438/16; 438/692; 430/30; 216/60
(58) Field of Classification Search ................ 438/692, 438/693, 28, 57, 7, 16; 257/E21.304, E21.305; 156/345.25; 430/316; 216/60

See application file for complete search history.

(56) References Cited

U.S. PATENT DOCUMENTS 5,972,787 A  10/1999 Boggs et al.
(Continued)

FOREIGN PATENT DOCUMENTS

EP  1 366 860  12/2003
(Continued)

OTHER PUBLICATIONS

Hartmannsgruber, et al., "A Selective CMP Process for Stacked low-k'CVD Oxide Films", Microelectronic Enginerring, vol. 50. p. 53-58, 2000.*
(Continued)

*Primary Examiner*—Steven Loke
*Assistant Examiner*—Earl N Taylor
(74) *Attorney, Agent, or Firm*—Hunton & Williams, LLP

(57) ABSTRACT

The aim of the invention is to create a simple monitoring or testing method for monitoring a reduction in thickness as material is removed from a bonded semiconductor wafer pair, which prevents failure effects as material is removed from wafers (polishing, grinding or lapping). In addition, the costs of the material removal process should be reduced by minimizing the complexity of monitoring, as well as by reducing the amount of resulting refuse. To this end, the invention provides a test structure (4, 5, 6, 7, 8, 9) comprised of a systematic row of a number of different depth trenches that are made in the (active) wafer (2). A thickness (h6; h7) of the active wafer (2) desired during material removal, particularly during a polishing, corresponds to the depth (t6; t7) of a reference trench (6; 7) of the trenches of the test structure, said reference trench (6) being surrounded by flatter and deeper trenches (5, 7). The active wafer (2), via the side (2a) on which the test structure was provided, is bonded to the second wafer of the semiconductor wafer pair provided as a supporting wafer (1). A removal of material, particularly a polishing, is effected on the rear (2b) of the active wafer (2) until the reference trench (6) is exposed. The result is visually observed (30) in order to monitor the reduction in thickness as material is removed from the first wafer (2).

19 Claims, 1 Drawing Sheet

U.S. PATENT DOCUMENTS

| | | | |
|---|---|---|---|
| 6,156,621 A * | 12/2000 | Nance et al. | 438/406 |
| 6,242,320 B1 * | 6/2001 | So | 438/406 |
| 6,514,858 B1 * | 2/2003 | Hause et al. | 438/640 |
| 6,515,826 B1 * | 2/2003 | Hsiao et al. | 360/126 |

FOREIGN PATENT DOCUMENTS

| JP | 03-076221 | 4/1991 |
|---|---|---|
| JP | 2003-017444 | 1/2003 |

OTHER PUBLICATIONS

Hartmannsgruber, et al., "A Selective CMP Process for Stacked low-$k$ CVD Oxide Films", Microelectronic Engineering, vol. 50, p. 53-58, 2000.

\* cited by examiner

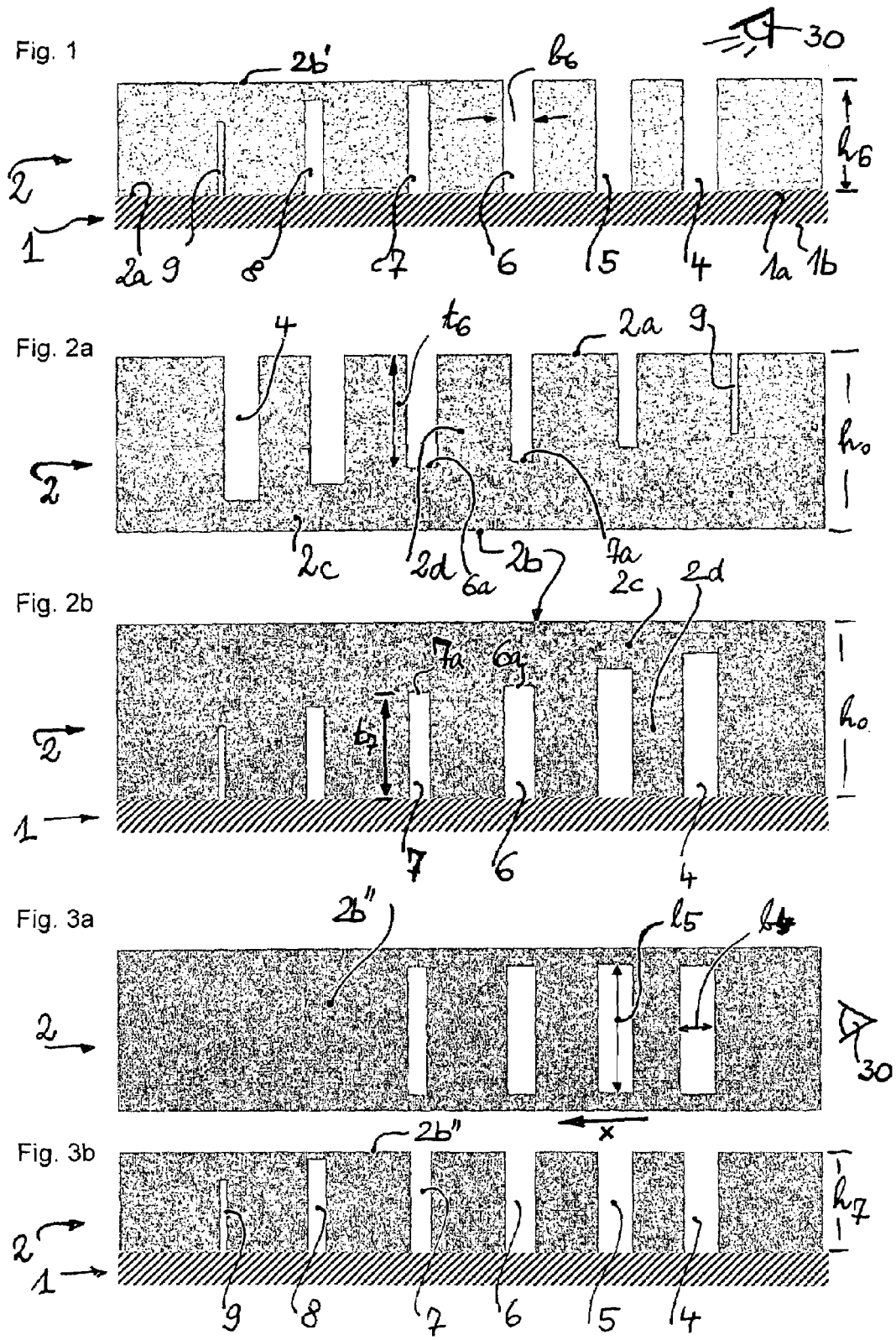

MONITORING THE REDUCTION IN THICKNESS AS MATERIAL IS REMOVED FROM A WAFER COMPOSITE AND TEST STRUCTURE FOR MONITORING REMOVAL OF MATERIAL

CROSS-REFERENCE TO RELATED APPLICATION(S)

This application is a U.S. National Phase of International Application No. PCT/DE2004/000801, filed Apr. 16, 2004.

FIELD OF INVENTION

The invention relates to the above-specified technical field in the context of manufacturing semiconductor wafers from two single connected wafers that are bonded together. More particularly, the invention relates to a method for monitoring the reduction in thickness of a wafer pair and a test device (test structure) provided at or in the wafer itself to enable the monitoring of the material removal.

BACKGROUND OF THE INVENTION

U.S. Pat. No. 6,242,320 (Sang Mun So) discloses differently deep trenches formed in a first wafer. A second wafer is also used. The trenches have alternating depths; a deeper trench is positioned between two shallower trenches. By means of two successive polishing steps illustrated in this document in FIGS. 2G and 2I, cf. column 4, lines 8 to 51, a uniform thickness of the upper wafer is achieved. The trenches are filled with an insulating material, cf. column 3, lines 20 to 29, acting as "polishing stops", associated with an intermediate etch process, in which the deeper trenches (indicated as 25) are etched down to a depth corresponding to the less deep trenches (indicated as 23), cf. FIG. 2H of this document.

U.S. Pat. No. 6,156,621 (Nance et al., Infineon) discloses a method for manufacturing a silicon-silicon oxide-silicon wafer, wherein initially isolation trenches (trenches) are provided in a homogeneous silicon wafer that is subsequently bonded with its surface to a second wafer. A conductive layer of polysilicon, indicated as 9 in this document, is located between the two wafers (2 and 3), which fills the trenches and also forms a connecting intermediate layer (indicated as 9, 4) between the two wafers. After grinding (thinning) the front side the isolation trenches may be exposed; the thinning process is performed prior to bonding this wafer to the polysilicon layer in order to form the wafer composite, cf. column 3, lines 18 to 23, or the German counter part DE 197 41 971, column 2, lines 31 to 39. The result is a double wafer including isolation trenches. Due to the influence of the support layer (i.e., the polysilicon layer 4) and to the risk of lattice defects and interferences as well as contaminations of the polished surface during a control measurement monitoring of the grinding and polishing thickness is difficult.

Depth measurements based on by step structures and conical configurations are disclosed in U.S. Pat. No. 6,514,858 (Hauser et al., AMD), cf. FIGS. 4A, 4B and 3C. During the removal process the width of the trenches increases, wherein the filling in was accomplished by means of a metal, which may optically be detected on the basis of its change in width in a step-like or continuous manner. The formation of trenches having a conically configured sidewall structure is technically difficult and is accompanied with an affording necessary measurement procedure on the semiconductor.

It is an object of the present invention to provide an efficient monitoring and test method, which reduces the failure effects of material removal from wafers, in particular of polishing and lapping. Moreover, costs of the removal process should be reduced by minimizing the complexity of the monitoring as well as resulting refuses, which otherwise may increase costs.

According to the present invention the object is solved by a test structure used in the context of a method. By this (efficient) test structure a system of trenches is determined, which may be used at least for a coarse determination of the amount of removal or removal depth.

The trenches are disposed in a systematic row. They are provided in a first wafer that is also referred to as device wafer (or active wafer) due to its function of receiving, after the reduction in thickness, active devices such as semiconductors or circuits in one or more later manufacturing processes.

The passive wafer is the carrier wafer, which may be an insulating wafer. The two wafers are bonded together by means of a bond connection acting as an area-like connection.

The systematic row of trenches defines a system of trenches of determined yet different depth, which are arranged in a sequence. The trenches and their different depths are obtained by etching on the basis of etch mask openings of a mask. By means of this etch process trenches of different width and thus different depth are formed in the active wafer. The active wafer later receives the active electronic circuitry, giving reason for its name "active wafer".

The amount or the removal depth during the material removal from the wafer, obtained for instance by polishing or lapping, is controlled on the basis of a desired (target) thickness of the active wafer, which is to be determined in advance. When the desired reduction in thickness is achieved the removal process may be terminated. In order to detect the end point of the removal process optical means are used for observing the process to monitor the reduction in thickness. To this end, a trench depth is assigned to the target thickness, that is, a trench from the systematic row is selected or determined in advance as a reference trench whose depth at least substantially corresponds to the desired thickness of the active wafer.

Unless one of the trenches located at the periphery is selected the reference trench is flanked by one less deep (shallower or flatter) trench and one deeper trench. Flanking is to be understood such that the trenches are neighbors of the reference trench. They are spaced apart yet are located not too far from the reference trench.

The process of selecting one of the trenches as a reference trench as described above may be performed in a later stage, after the active wafer and the carrier wafer are bonded together. To this end, the trenches are bonded upside down, that is, with their open or upper side facing downwards, onto the surface of the carrier wafer. The top side is the side on which the test structure is located, that is, the surface in which the systematic row of the plurality of trenches has been formed. This side is bonded to the carrier wafer.

When in the process of the wafer treatment the material removal is performed in the active wafer, that is, on the backside of the active wafer, the thickness thereof is reduced. This material removal is continued until the reference trench is visible from the backside of the active wafer. The bottom thereof is exposed, that is, this trench is visible at all. This is detected by the observation means.

For detection the removal process may be interrupted and may then, if the reference trench is not detected by the observation means, continued. This monitoring process may be repeated once or several times until the reference trench is exposed, that is, its bottom is removed by the removal process and thus the reference trench is detected by the optical means.

By means of a test structure configured in such a manner a determination of thickness during the removal process may be accomplished by an efficient optical, and in particular a visual control. First, the deeper and broader trenches are observed successively during the thinning of the wafer, which may be detected optically.

The thickness reduction in the vertical direction is thus mapped into a horizontal direction, which may optically detected more efficiently. One obtains a relationship x(t), that is, a distance vs. depth diagram, which exposes increasingly more trenches when the remaining height of the active wafer is continuously being reduced. The removal process is terminated when the reference trench is exposed.

If, for example, a removal process for exposing one of the trenches of the systematic row previously formed in the active wafer is considered, the test structure may be configured such that the desired depth of the isolation trench of the wafer is located in the central region of the row of the differently deep trenches. The trench indicating the desired depth is flanked by trenches of less depth and trenches of increased depth.

During the formation of the trenches in the active wafer a respective reference trench of the test structure is formed with the same depth when having the same width as a different trench. The broader trenches automatically result in an increased depth during etching, while the narrower trenches result in a reduced depth, cf. U.S. Pat. No. 6,515,826 B1 (Hsiao, IBM), abstract and FIGS. 15 and 16 thereof, emphasizing on the progression of the trench depth vs. the opening width.

If two trenches of different width are etched, determined by the etch mask, also trenches o different depth are obtained for identical etch times.

BRIEF DESCRIPTION OF THE FIGURES

The invention will be explained in more detail on the basis of illustrative embodiments.

FIG. 1 illustrates a test structure in a cross-sectional view. It is shown a cross-section of a row of trenches opened by a removal process and of trenches still closed when viewed from the (empty) front side of the active wafer of an SO1 wafer assembly. The trenches of reduced depth are still closed.

FIG. 2a is a further embodiment of a portion of the device wafer 2 including a sequence of deep and broad trenches spaced apart from each other.

FIG. 2b is the embodiment of FIG. 2a, bonded to a carrier wafer 1 upside down, wherein the trenches are closed by the bonding process.

FIG. 3a is a top view (when viewed from the removal side 2b") of the sectional view of FIG. 3a.

FIG. 3b is a vertical section corresponding to that of FIG. 1 in a manufacturing stage, in which an increased portion of the first bonded wafer 2 is removed in the height direction so that a greater number of trenches are exposed compared to the embodiment of FIG. 1.

FIG. 1 is a cross-sectional view. Reference numeral 1 represents an insulating layer, for example, a carrier wafer made of silicon dioxide. The active layer 2 is made of, for instance, silicon. It is also referred to as semiconductor layer or device wafer. The top side 2b' of the active layer 2 is depicted in an already thinned state so that three trenches of the plurality of trenches 4, 5, 6, 7, 8, 9 are already opened. The other three trenches are still closed. The wafer has a height $h_6$ that substantially corresponds to the depth of the trench 6 having a width $b_6$. Respective widths $b_4$ to $b_9$ correspond to the trenches 4 to 9, respectively.

Illustrated in FIG. 1 is the result of the method after performing all of the method steps required for the thinned bonded wafer pair.

An optical device 30, schematically depicted, is configured to detect open trenches, the bottom sides of which were removed during the removal process, which may be a polishing process or a grinding process or a lapping process. Hereby, the human eye, a technical microscope or a magnifying lens may be used. The removal device, which may be a chemical mechanical polishing tool, in short a CMP, is not shown.

The entire trench structure as a systematic row of a plurality of trenches forms the test structure. The structure is located in the semiconductor wafer, which may receive in a later stage an active electronic circuit—also not illustrated—located at a position that does not lie directly in or between the trenches, but that may also be spaced apart therefrom.

In FIG. 2a there is shown an example of a semiconductor wafer 2 not yet applied to the insulating layer 1 in an upside down configuration is. Here the same trenches as in FIG. 1 are shown that have different width and different depth, while the semiconductor wafer 2 is still thicker. It has a basic thickness $h_0$. Trenches are formed in the semiconductor wafer 2, which form as trenches 4 to 9 a systematic row, ordered by depth and width, wherein during the etch process that is not explicitly shown the broad trenches automatically receive a greater depth as may be appreciated by the skilled person. The trench 4 has the greatest depth and the greatest width. The trench 9 has the smallest depth and the smallest width.

A respective trench bottom represents the end of the etch process and is indicated for each trench with the reference numeral of the respective trench with an additional letter "a". Thus, 6a is the trench bottom of the trench 6, 7a is the trench bottom of the trench 7.

Hence, the device wafer 2 has two height sections, that is, the section 2d, in which the trenches are formed, and a further section 2c, which has no trenches formed therein. Both sections are commonly applied to the second wafer 1 of the wafer pair, using the top sides 2a, i.e., the side from which the test structure was formed. This second wafer may be an insulating layer, formed of, for instance, silicon dioxide. A bonding process is performed in which both wafers are firmly connected to each other.

The result of the removal of the section 2c of the device wafer is shown in FIG. 1 for the case that the removal was performed to such a depth that $h_0$ is reduced to $h_6$ in order to just expose the trench bottom 6a and to make the trench 6 of width 6b visible for the optical device 30. In this state the surface 2b is reduced compared to the remaining surface 2b', as shown in FIG. 1.

The trench 6 is located substantially in the central region of the row of trenches 4 to 9, so that at both sides thereof trenches are provided, which systematically become deeper and shallower, respectively. From this, a description of a systematic row of trenches results, which has a different depth and is located in the active wafer that is to receive an active electronic circuit in a later stage. The desired thickness $h_6$ is the target thickness or the target value, to which the thickness is to be reduced. This thickness aimed at as a target value substantially corresponds to the depth $t_6$ of the trench 6. The more frequently the removal process is interrupted in order to detect the exposure of the reference trench 6 by means of the measurement device 30, the more accurately the removal process may be controlled. Since the reference trench is flanked by at least one deeper trench and at least one shallower trench, that is, these trenches are arranged in parallel, the reduction in thickness with respect to the vertical direction may be mapped to the visible plane.

The removal process is performed from the opposite side 2b, which is located oppositely with respect to the top side 2a of the formation of the trenches of the test structure.

The optical device represents a magnifying lens, the human eye or a microscope.

FIG. 2b illustrates a further embodiment, which shows a perform of the result of FIG. 1. The same reference numerals are used so as to maintain conciseness of the 20 description while nevertheless providing a more detailed understanding. Applying the embodiment of FIG. 2a with its top side 2a to the top side 1a of the insulating layer 1 yields an SOI structure with all the trenches 4 to 9 still closed. The respective trenches may become visible upon performing the removal process from the side 2b. The opposing side of the wafer composite formed from bonded wafers is 1b and forms the bottom side for this process step. Here the bonded wafer is supported.

The height of the device wafer is still ho prior to starting thinning the upper portion 2c of this wafer. The lower portion 2d comprising the trenches in the systematic row is removed only partially to an extent that the reference trench may be detected by the optical device 30.

By way of example, two reference trenches are indicated as 6 and 7, which shall be separately explained.

The trenches of different depth of the systematic row represent a gradation of the trench depth and a gradation of the trench width. Trench 6 is deeper and broader compared to trench 7. During the formation of this trench by an etch process using an etch mask having six openings of different width the trenches as shown are formed.

Trench 6 is detectable (becomes visible), when the height ho is reduced by the not depicted reduction height by $h_0-h_6$ so that the bottom 6a is removed and the trench is exposed. The optical device 30 may detect this event, when the removal process is discontinued in a temporal neighbourhood with respect to the exposure of this trench and an optical monitoring process is performed intermittently.

If the trench is not yet visible the removal process may be continued. If the trench is already observable, the removal process may be terminated, as is shown in FIG. 1.

At reference trench 7 the bottom 7a is concerned, that is, the narrower and less deep trench 7 having the depth $t_7$. When the removal height is increased to $h_0-t_7$, first the trench 6 is exposed, and during the further removal process trench 7 is exposed, too, which may also be detected by the optical device 30.

A corresponding regime also applies for each of the trenches, for the peripheral trenches 4 and 9 as well, which may also be used for the detection; however, preferably trenches may be used for detection, which are located in the central region of the systematic row of trenches, as is explained above when referring to two removal depths of the alternative reference trenches 6 and 7.

In a further embodiment of FIG. 3a the device wafer 2, comprised of, for instance, silicon, is depicted in a top view, after a state is reached as is explained with reference to FIG. 2 with respect to the trench 7 and the respective removal depth and removal device.

All trenches are recognizable as stripe-like trenches each having a length and width. For example, the trench 5 had a length l5, the trench 4 has a width $b_4$. Respective characteristics also apply to all other trenches. The length is greater compared to the width, but in the systematic row the width decreases as the depth of the trenches 4 to 9 should decrease.

After the removal the surface 2b″ is formed, which is scanned by the optical device with respect to visibility of the reference trench 7.

This state having the removed height $h_7$ of the device wafer 2 is shown in FIG. 3b in a cross-sectional view.

The lateral direction x maps the depth direction h/t. The more wafer material is removed in the depth direction the more stripes having an increasingly reduced width are formed in the lateral direction x.

The order of magnitude of the trenches, the trench width, the trench depth and the spacing between the trenches may be tailored according to the requirements of the application.

Two exemplary configuration sizes may be given, for instance a maximum trench width of 5 µm for the broadest and deepest trench 4, and a gradation of, for instance, 0.5 µm with respect to the trench width and thus the trench depth. As a pattern for spacings between the trenches a measure of, for instance, 10 µm may be recommended. The trenches may be positioned such that the form a fixed pattern with different widths, which may correspond in electronic applications to pulse width modulation that is here applied to the trench width in a systematic row of trenches of different sizes.

The trenches may be filled with an insulating material or a conductive material, such as silicon dioxide and polysilicon, respectively, instead of being unfilled. The optical device may be configured to optically distinguish the different materials, for instance by reflection, by colour or based on material composition.

I claim:

1. A method of manufacturing a bonded pair of semiconductor wafers, having an active wafer and a second wafer, by monitoring a reduction in thickness of one of the wafers during manufacturing, the method comprising
    forming a test structure having a systematic row of trenches in the active wafer, said trenches having different defined widths, said active wafer provided for receiving an active circuit in a later step;
    bonding the active wafer with a side which holds the test structure onto the second wafer of the semiconductor wafer pair;
    wherein a targeted thickness of the active wafer after a removal of wafer material corresponds at least substantially to a reference depth of a reference trench in the row of trenches in said test structure, said reference trench neighbored by a shallower and a deeper trench;
    performing the wafer material removal, commencing from a backside of the bonded active wafer until the reference trench is exposed, and optically detecting said exposure of the reference trench, for monitoring a thickness reduction of the active wafer; and
    forming at least one active circuit in said active wafer in said later step.

2. The method of claim 1, wherein the systematic row comprises trenches of different, increasing depths, and the material removal comprises a polishing step.

3. The method of claim 2, wherein deep trenches are formed in an etch process using an etch mask having openings of different widths for the trenches of different widths.

4. The method of claim 1, wherein the trenches are not filled or unfilled prior to bonding the active wafer to the second wafer.

5. The method of claim 1, wherein the active wafer is a wafer formed of a semiconductor crystal.

6. The method of claim 1, wherein the second wafer at least comprises an insulating layer.

7. The method of claim 1, wherein the systematic row is a sequence of trenches that become continuously shallower or continuously deeper.

8. The method of claim 1 or 7, wherein the trenches are formed as stripe-like trenches each having a certain depth and width, and wherein a respective depth increases as the corresponding width increases.

9. The method of claim 1, wherein prior to reaching a bottom of the reference trench by the removal process, and prior to exposing the reference trench, the removal process is interrupted at least once for one of an optical monitoring and observation, as said optical detection.

10. The method of claim 1, wherein the targeted thickness is the desired or a predefined target thickness.

11. The method of claim 9 or 1, wherein an optical device is directed towards the backside of the active wafer for the optical detection, and the removal process comprising a polishing process, performed from the backside and terminating when the optical detection reveals exposure of a bottom end of the reference trench.

12. The method of claim 1, wherein the second wafer is a carrier wafer.

13. The method of claim 1, wherein the row of trenches comprising a plurality of parallel trenches, each having a different width.

14. The method of claim 1, wherein the neighboring trenches are several deeper and several shallower trenches.

15. The method of claim 3, wherein the etch process is performed prior to bonding the active wafer onto the second wafer as carrier wafer.

16. The method of claim 4, the not filled trenches being open prior to said bonding.

17. The method of claim 5, the active wafer is comprised of silicon.

18. The method of claim 6, the second wafer as carrier wafer comprises the insulating layer formed of silicon dioxide.

19. A method of monitoring a reduction in thickness during a production of a bonded pair of semiconductor wafers, having an active and a carrier wafer;

the method comprising:
forming a test structure having a systematic row of trenches in said active wafer, said trenches having different defined widths, said active wafer provided for receiving an active circuit in a later step;

bonding the active wafer with a side which holds the test structure onto the carrier wafer of the pair of semiconductor wafers;

performing a wafer material removal comprising a polishing process, commencing from a backside of the bonded active wafer until a reference trench is exposed, and optically detecting the exposure for monitoring thickness reduction of the active wafer down to a target thickness; and forming an active circuit in said active wafer in said later step;

wherein the target thickness of the active wafer upon said material removal corresponds to a depth of said reference trench of the row of trenches in said test structure, said reference trench neighbored by a shallower and a deeper trench, and said neighboring trenches are several deeper trenches on one side of the reference trench and several shallower trenches on the other side of the reference trench.

* * * * *